United States Patent [19]

Shi

[11] Patent Number: 5,473,047
[45] Date of Patent: Dec. 5, 1995

[54] SOLUBLE PRECURSOR TO POLY (CYANOTEREPHTHALYDENE) AND METHOD OF PREPARATION

[75] Inventor: Song Q. Shi, Phoenix, Ariz.

[73] Assignee: Motorola, Inc., Schaumburg, Ill.

[21] Appl. No.: 322,501

[22] Filed: Oct. 11, 1994

[51] Int. Cl.$^6$ ................................................. C08G 73/10
[52] U.S. Cl. ........................ 528/310; 528/312; 528/316; 528/314; 528/318
[58] Field of Search ................................... 528/310, 312, 528/316, 317, 318

[56] References Cited

U.S. PATENT DOCUMENTS

| | | | |
|---|---|---|---|
| 4,766,198 | 8/1988 | Harper | 528/377 |
| 4,808,681 | 2/1989 | Harper et al. | 528/380 |
| 5,185,100 | 2/1993 | Han et al. | 528/422 |
| 5,189,136 | 2/1993 | Wudl et al. | 528/86 |

OTHER PUBLICATIONS

Robert W. Lenz et al., "Thermally Stable Hydrocarbon Polymers: Polyterephthalylidenes", J. Org Chem, May 1960, pp. 813–817.

N. C. Greenham et al., "Efficient Light–Emitting Diodes Based on Polymers With High Electron Affinities", Nature, 1993, pp. 628–630.

Primary Examiner—James J. Seidleck
Assistant Examiner—Duc Truong
Attorney, Agent, or Firm—Eugene A. Parsons

[57] ABSTRACT

A method of preparing a lass of PPV derivatives includes preparing a soluble precursor of a PPV derivative and converting the soluble precursor to a PPV derivative. The converting includes performing either a thermal treatment in a range of temperatures from approximately 25° C. to 400° C. at a reduced pressure or an acid-catalyzed ultraviolet radiation treatment.

16 Claims, 1 Drawing Sheet

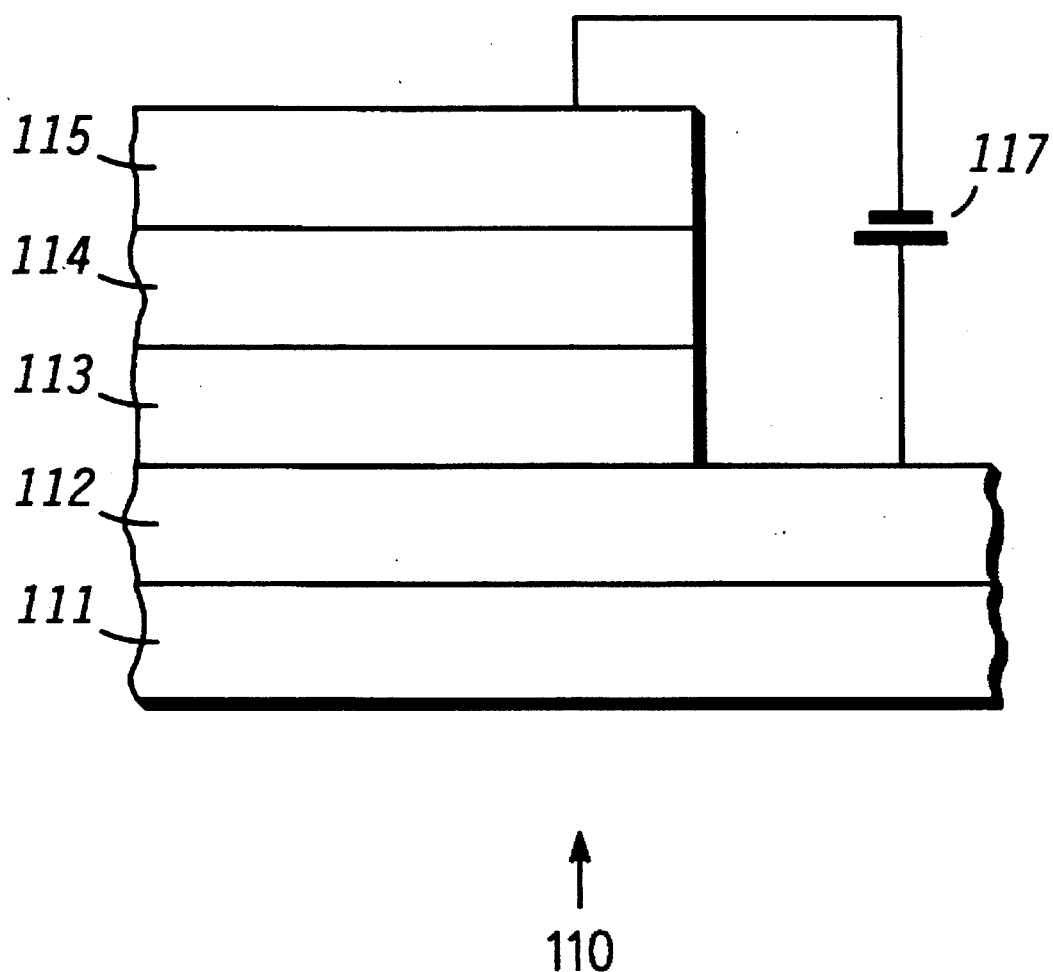

SOLUBLE PRECURSOR TO POLY (CYANOTEREPHTHALYDENE) AND METHOD OF PREPARATION

FIELD OF THE INVENTION

This invention is related to a class of organic polymeric materials for use in optoelectronic devices such as light emitting diodes, more specifically the invention is related to poly(phenylene vinylene) derivatives and their new preparation method.

BACKGROUND OF THE INVENTION

Unlike inorganic semiconductor light emitting devices, polymer light emitting devices are generally simple and relatively easy and inexpensive to fabricate. Also, a variety of colors and large-area devices are easily attained. However, one major problem in prior art polymers used in light emitting devices is that most of them have relative low quantum efficiency. For example. poly(phenylene vinylene) (PPV), one of the most studied polymers for LED application, has electroluminescence (EL) quantum efficiency approximately 0.06% with magnesium as n-contact metal electrode. Therefore the challenge is to improve the fluorescent efficiencies of polymers so that polymer light emitting devices can be practically useful.

Since the first report of electroluminescence in organic polymer, specifically poly(phenylene vinylene) (PPV), a variety of polymers have been shown to exhibit electroluminescence. However, it has been found necessary in most case to use metals with low work functions, such as calcium, magnesium, lithium, as the electron injecting contact in order to achieve good electroluminescent efficiencies. Since metals with low work functions are normally susceptible to atmospheric degradation, and are difficult to process and encapsulate, it would be of great advantage to be able use metals with higher work functions, such as aluminum, which can be easily processed and have much better ambient stability, as electron injecting contacts.

In 1993, a group from the University of Cambridge reported that light emitting devices fabricated from several soluble derivatives of poly(cyanoterephthalydene) (CN-PPV), dialkoxy CN-PPVs, have internal electroluminescent quantum efficiency of 4%. More importantly, LEDs with metals of higher work functions as electron injecting contacts, such as aluminum, were found to be as efficient as electron injecting contacts as those with metals of low work functions, such as magnesium, calcium, etc. The high electron affinities of the dialkoxy CN-PPVs, which make the injection of electrons from aluminum possible, are being credited for the marked improvement.

Though the above prior art represents an important step in the development of polymer light emitting devices with stable contacts, the emission of the prior art polymer with a peak around 710 nm is in a region of the visible spectrum less sensible to human eyes. Therefore the prior art polymer is hardly useful for display purpose.

The problem could be partially solved by using the pristine CN-PPV, which has even higher electron affinity, yet lower emission wavelength that is more desirable for display applications.

The preparation of CN-PPV was first disclosed in 1960 by Lenz and coworker in their search for polymers that have the thermal stability of polytetrafluoroethylene (Teflon). Though CN-PPV is thermally stable up to 500° C., the lack of convenient processability, due to its insolubility and infusibility, has hindered its development for any practical applications.

It is a purpose of this invention to provide a new precursor route method for the preparation of poly(phenylene vinylene) and its derivatives.

It is another purpose of this invention to provide a class of new processable precursors to CN-PPV for use in light emitting devices.

It is still another purpose of this invention to provide a preparation method for a class of new processable precursors to CN-PPV for use in light emitting devices.

It is a further purpose of this invention to provide a class of new processable precursors to CN-PPV for use in light emitting devices with stable electron injecting contacts.

SUMMARY OF THE INVENTION

The above described problems and others are substantially solved and the above purposes and others are realized in a method of preparing PPV derivatives including preparing a soluble precursor of a PPV derivative and converting the soluble precursor to a PPV derivative. The converting includes performing either a thermal treatment in a range of temperatures from approximately 25° C. to 400° C. at a reduced pressure or an acid-catalyzed ultraviolet radiation treatment.

The above described problems and others are substantially solved and the above purposes and others are further realized in a method of fabricating an organic light emitting device including the steps of forming a first conductive layer having a first type of conductivity on the planar surface of a substrate, preparing a soluble precursor of a PPV derivative, supporting a layer of the soluble precursor on the first conductive layer, converting the layer of the soluble precursor to a PPV derivative, and positioning a second conductive layer having a second type of conductivity on the layer of PPV derivative material, the second conductive layer including a metal as n-contact.

The above described problems and others are substantially solved and the above purposes and others are further realized in an organic light emitting device including a first conductive layer having a first type of conductivity, a layer of first carrier transporting material positioned on the first conductive layer, a layer of PPV derivative material positioned on the layer of first carrier transporting material as an emissive layer, and a second conductive layer having a second type of conductivity positioned on the layer of PPV derivative material, the second conductive layer including a metal as n-contact.

BRIEF DESCRIPTION OF THE DRAWINGS

The single FIGURE is a simplified sectional view of a light emitting diode in accordance with the present invention.

DESCRIPTION OF THE PREFERRED EMBODIMENTS

Poly(phenylene vinylene) (PPV) and its derivative are generally synthesized from a sulfonium salt precursor polymer (2) by a thermal or radiation treatment. The precursor polymer (2) is in turn prepared by polymerization of arylene-p-bis(methylene sulfonium halide) (1) with a base such as sodium hydroxide, in a reaction such as that illustrated below (including the designating numbers). However, due to the strong electron withdrawing ability of the cyano group, CN-PPV can not be obtained from the conventional precursor method.

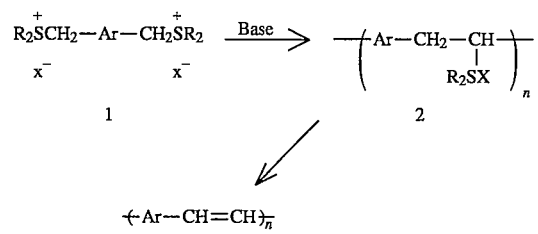

In the prior art, CN-PPV and its derivative are prepared by Knoevenagel condensation polymerization of an aromatic dialdehyde (3) and an aromatic diacetonitrile (4), generally in accordance with the reaction illustrated below (including the designating numbers).

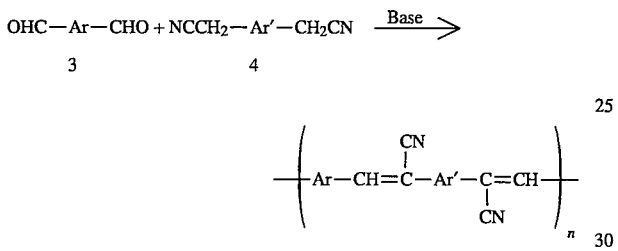

Since CN-PPV is an intractable polymer, in the prior art long alkoxyl groups are incorporated into the backbone of CN-PPV in order to achieve the needed solubility in organic solvents. However, along with the gain in solubility, those alkoxy groups also alter the electronic structure of CN-PPV and, more specifically, the band gap width, and the HOMO and LUMO energy levels of CN-PPV. As a result, the emission of the dialkoxy CN-PPV is shifted, with respect to CN-PPV, to the deep red region which is far less sensible to the human eye. It would clearly be advantageous to acquire the needed processability without disturbing the electronic structure of CN-PPV, so that the light emission falls in the desirable region for display purposes.

The strategy disclosed herein is the use of a new precursor route, which involves the preparation of a processable precursor polymer and subsequent conversion of the precursor polymer to a conjugated polymer. The advantage of the precursor polymer route method is that the precursor polymer can be molded into any desired physical shape such as films and fibers prior to the conversion to the final conjugated polymer. Therefore, it is possible to make use of the prior known polymers that are otherwise not processable for practical applications.

In general, the new method for preparation of PPV derivatives via a precursor polymer route consists of two stages: 1) the preparation of a precursor polymer; 2) the conversion of the precursor polymer to PPV derivatives.

The preparation of the precursor polymer includes deprotonation of a p-xylene derivative (10) with a base at low temperature; formation of an intermediate polymer by the addition of an aromatic dialdehyde (11); and trapping the intermediate polymer (12) with an organic trapping reagent to form a soluble precursor polymer (13). The reaction process for the preparation of the precursor polymer is depicted in Scheme I, illustrated below (including the designating numbers):

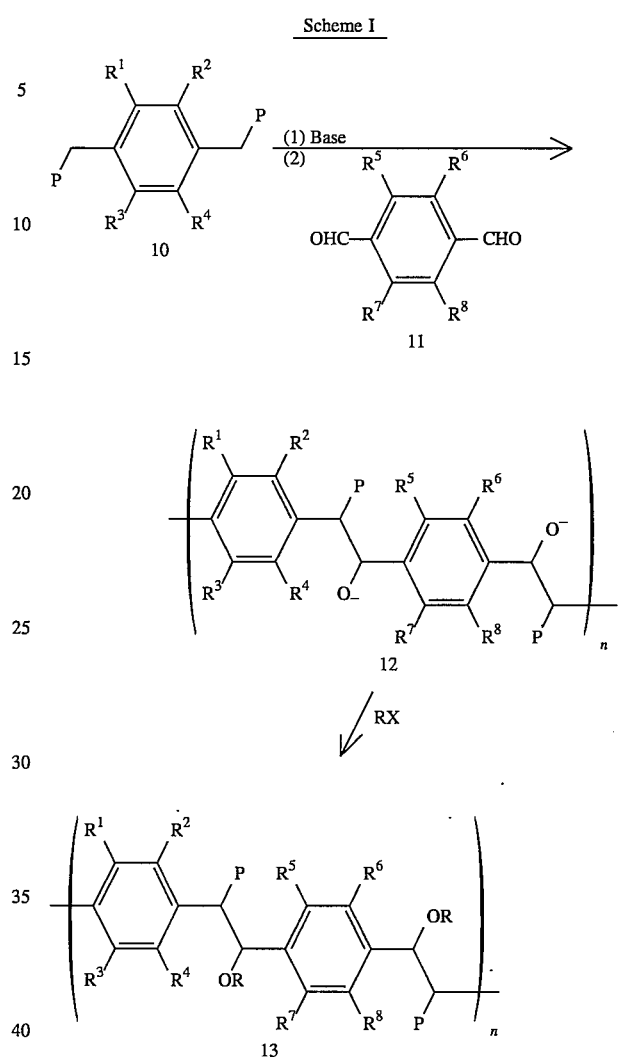

where:

P is hydrogen or an electron withdrawing group such as cyano, nitro, or fluoride.

RX is an organic trapping reagent and will be described in detail shortly hereafter;

$R^1$ to $R^8$ represent substitutional possibilities at each position and each represents hydrogen or hydrocarbon groups or functional groups such as cyano, nitro, halogen, haloalkyl, haloalkoxy, alkoxyl, amido, amino, sulfonyl, carbonyl, carbonyloxy and oxycarbonyl etc., with the provision that $R^1$ and $R^2$ together, $R^3$ and $R^4$ together, $R^5$ and $R^6$ together, $R^7$ and $R^8$ together can form a fused benzo ring; and n is the average number of repeating units in a single polymer molecule.

The selection of the base used in the deprotonation of the p-xylene derivative depends on the acidity of the specific p-xylene derivative. Generally speaking, the weaker the acidity of the p-xylene derivative, the stronger the basicity of the base needed. As an example, the following base materials that can be used to deprotonate the p-xylene derivative are arranged in the order of increasing basicity: $NaOH<ROK<CH_3SO_2CH_2Li<NaNH_2<NaH<PhLi<CH_3Li$. The acidity of the p-xylene derivative is lowered by the substitute group either on the phenyl ring or on the benzylic position with an electron withdrawing ability such as nitro, cyano, sulfonate, carboxylic group. The acidity of the p-xylene derivative can also be lowered by replacing one or more carbon atoms in the phenyl ring with atoms of higher electron affinities such as nitrogen, resulting in a pyridine or pyrazine derivative.

The polymerization temperature is controlled so that little or no elimination reaction of the intermediate material that leads to the insoluble conjugated polymer occurs. In general, the polymerization temperature is preferred to be below approximately 0° C.

The organic trapping reagent, RX, includes, for example, carboxylic acid anhydrides, carboxylic acid chloride, alkyl sulfonyl chloride, carboxylic ester, or xanthate ester. A few specific examples of organic trapping reagents which can be utilized are acetic anhydride, trifluoroacetic anhydride, acetic chloride, methanesulfonyl chloride, and carbon disulfide/ methyl iodide. The selection of the organic trapping reagent is determined by the desired solubility of the resulting precursor polymer and the ease with which the ester leaving group that has been formed by the reaction of the organic trapping reagent (RX) with the intermediate polymer (12) can be eliminated in the step of converting the precursor polymer to a fully conjugated PPV derivative.

The precursor polymer is generally soluble in polar aprotic solvents such as N,N-dimethylformamide, dimethyl sulfoxide, N-methylpyrrolidone, hexamethylphosphoric triamide, etc. and partially soluble in ether aprotic solvents such as tetrahydrofuran, dimethoxyethane, diethylene glycol dimethylether. Also, the precursor polymer is purified by successive precipitation: 1) from tetrahydrofuran solution with water; 2) from N-methylpyrrolidone with water; and (3) from N-methylpyrrolidone with methanol, followed by washing copiously with methanol, ethyl ether.

The conversion of the precursor polymer (13) is carried out by either a thermal treatment or an acid-catalyzed ultraviolet radiation treatment. The chemical reaction process is described in Scheme II, illustrated below:

Scheme II

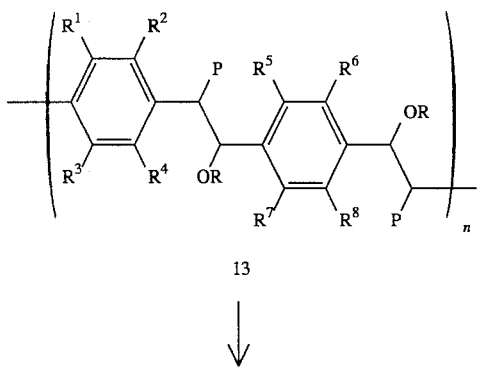

13

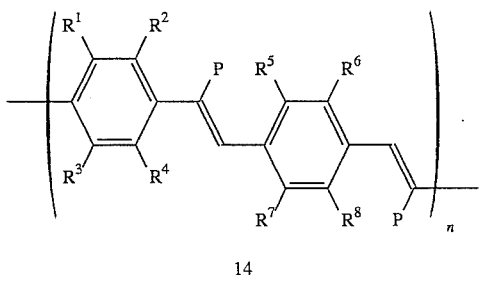

14 where the soluble precursor polymer (13) is from Scheme I above and $R^1$ to $R^8$, P, R and n are the same as described in Scheme I above.

In the thermal treatment, the conversion temperature can vary from approximately 25° C. to 400° C., depending on the ester leaving group in the precursor polymer, which ester leaving group has been formed by the organic trapping reagent (RX) in the preparation of the precursor polymer. The preferred conversion temperature is from approximately 120° C. to 300° C. If the conversion temperature is lower than 120° C. the precursor polymer is usually not stable at room temperature due to the premature elimination of the ester leaving group. On the other hand, if the conversion temperature is over 300° C., the ester leaving group normally can not be completely eliminated during the conversion, resulting in a partially conjugated PPV derivative. Besides, the higher temperature (>300° C.) process complicates the organic semiconductor device fabrication, because the organic materials involved usually have limited temperature tolerance.

The new precursor route outlined in the above embodiment is especially useful for the preparation of PPV derivatives bearing electron withdrawing groups, such as CN-PPV. The PPV derivatives bearing electron withdrawing groups normally have high electron affinities and, thus, are suitable for use as electron injecting and transporting materials in organic light emitting devices. In general, the polymers prepared by the novel new precursor route can not be prepared from the prior art sulfonium precursor route. Even though some polymers can be prepared by Knoevenagel condensation polymerization, only intractable polymers are obtained.

By following the above described new precursor route for the synthesis of PPV derivatives, a new class of precursors to CN-PPV, which are soluble in organic solvents, are provided. Referring to Scheme III, illustrated below, the new synthetic approach for the CN-PPV precursor is described utilizing a specific embodiment. Equivalent amounts of terephthaldehyde and p-phenylenediacetonitrile undergo condensation polymerization as follows:

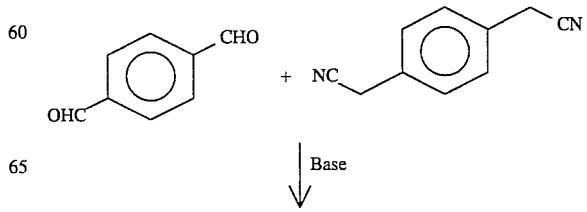

| Base

-continued

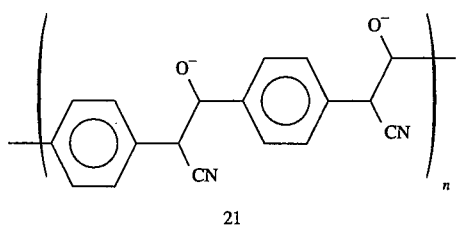

21

↓ RX

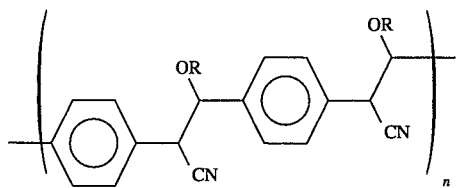

22

The polymerization proceeds in the presence of a base material, such as potassium t-butoxide, in tetrahydrofuran solution at a temperature <0° C.; the intermediate polymer (21) is trapped by the addition of an excess amount of an organic trapping reagent that is designated as RX in Scheme III to provide a precursor polymer (22). The principles for the selection of the base and the trapping reagents for the CN-PPV precursor synthesis are the same as those discussed in Scheme I. A few examples of the trapping reagents are acetic anhydride, trifluoroacetic anhydride, $CS_2/CH_3I$, etc.

The precursor polymer (22) is soluble in polar aprotic solvents such as N,N-dimethylacetamide, dimethylsulfoxide, N-methylpyrrolidinone, and partially soluble in ether aprotic solvents such as tetrahydrofuran, dimethoxyethane, diethylene glycol dimethylether. Films of the precursor polymer (22) are spin-coated from one of the polar or ether aprotic solvent solutions onto a substrate and converted to CN-PPV under vacuum at high temperature as depicted below in Scheme IV.

Scheme IV

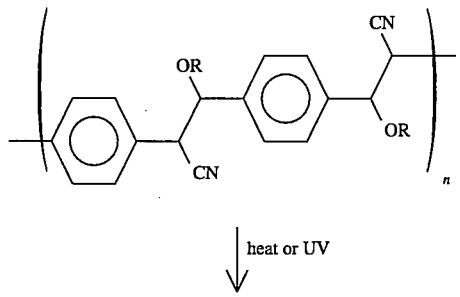

↓ heat or UV

-continued
Scheme IV

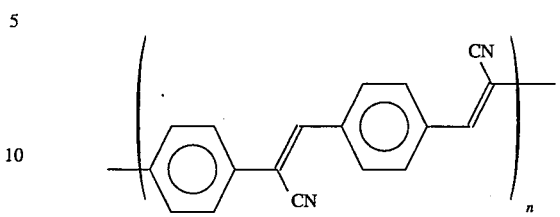

The present invention also includes the use of CN-PPV, derived from the embodied precursor route method described above, in organic light emitting devices with stable metal contacts, such as aluminum.

Referring specifically to the figure, a light emitting device (LED) 110 is illustrated in a simplified cross-sectional view. Generally, LED 110 includes a substrate 111 which in this specific embodiment is a glass plate having a relatively planar upper surface. An electrically conductive layer 112 is deposited on the planar surface of substrate 111 so as to form a relatively uniform electrical contact. A layer 113 of hole transporting material is deposited on the surface of conductive layer 112. A layer 114 of PPV derivative obtained by the present precursor method is deposited onto the surface of layer 113. Then a second electrically conductive layer 115 is deposited on the upper surface of layer 114 to form a second electrical contact.

In this embodiment, because layer 114 is composed of a PPV derivative obtained by the present precursor method, electrically conductive layer 115 can be formed of a relatively high work function metal, which in this specific embodiment is aluminum. The ability to use aluminum rather than some of the more exotic low work function metals greatly simplifies the device fabrication process.

While it should be understood that light generated within polymer layer 114 can be emitted either through layers 113, 112 and substrate 111 or through layer 115, in the present embodiment conductive layer 112 is formed of organic or inorganic conductors, such as conductive polyaniline (PANI), indium-tin-oxide (ITO), which are substantially transparent to visible light so that the emitted light exits downwardly through substrate 111 in the figure.

Also, in the figure, LED 110 has a potential applied between layers 112 and 115 by means of a potential source 117. In this embodiment electrically conductive layer 112 is a p-type contact and electrically conductive layer 115 is an n-type contact. The negative terminal of potential source 117 is connected to electrically conductive layer 115 and the positive terminal is connected to electrically conductive layer 112. Electrons are injected from the n-type contact into fluorescent PPV derivative layer 114 and holes injected from the p-type contact are transported through layer 113 and into fluorescent PPV derivative layer 114 where, upon an electron and a hole recombination, a photon is emitted.

In general, it should be understood that layer 113 of organic hole transporting material is optional. If, however, organic LED 110 is modified by omitting layer 113, the device is still operational, but its operating efficiency is reduced.

EXAMPLES

This invention will be further described by the following examples, which are intended to illustrate specific embodiments of the invention but not to limit its scope.

Example 1

The following synthesis of an acetate derivative of precursor polymer (22) ($R=CH_3CO$) can be used to prepare all carboxylic ester derivatives of (22).

A solution of 40 mmol of potassium tert-butoxide (Eastman Kodak Company) in 300 mL of dry tetrahydrofuran is purged with argon for fifteen minutes while it is cooled to −30° to −40° C. with a dry ice/cyclohexanone bath. To the solution is added a solution of 20 mmol of 1,4-phenylenediacetonitrile (Aldrich Chemical Company) in 25 mL of dry tetrahydrofuran under argon. The reaction mixture turns dark brown. After the reaction mixture has been stirred at −30° to −40° C. for half an hour, it is added with a solution of 20 mmol of terephthaldehyde (Fluka Chemical Company) in 20 mL of tetrahydrofuran through a syringe with stirring under argon. The resulting mixture is allowed to polymerize at −30° to −40° C. for two hours. At the end, 8 mL of acetic anhydride (Fisher Scientific company) is added to the polymerization mixture. The reaction mixture is left to stir overnight. During that time, the reaction temperature gradually rises to room temperature. The reaction mixture is poured into a beaker containing 400 mL of deionized water. The yellowish solid collected by filtration is washed with 400 mL of deionized water and 400 mL of 2-propanol, successively. The crude polymer is further purified by redissolving it in a minimum amount of tetrahydrofuran (small amount of N-methyl-2-pyrrolidone may be added to facilitate the dissolution of the polymer), and reprecipitating it into deionized water. The final polymer collected by filtration is washed with methanol, ethyl ether, and dried under vacuum to afford 70–80% yields.

The structure of the precursor polymer is confirmed by Infrared, $H^1$ and $C^{13}$ NMR, UV-visible spectra as well as elemental analysis data.

Example 2

The following synthesis of methyl xanthate derivative of precursor polymer (22) (R=CH$_3$SCS) can be used to prepare all other xanthate ester derivatives of (22).

A solution of 40 mmol of potassium tert-butoxide (Eastman Kodak Company) in 300 mL of dry tetrahydrofuran is purged with argon for fifteen minutes while it is cooled to −30° to −40° C. with a dry ice/cyclohexanone bath. To the solution is added a solution of 20 mmol of 1,4-phenylenediacetonitrile (Aldrich Chemical Company) in 25 mL of dry tetrahydrofuran under argon. The reaction mixture turns dark brown. After the reaction mixture has been stirred at −30° to −40° C. for half an hour, it is added with a solution of 20 mmol of terephthaldehyde (Fluka Chemical Company) in 20 mL of tetrahydrofuran through a syringe with stirring under argon. The resulting mixture is allowed to polymerize at −30° to −40° C. for two hours, before 50 mmol of carbon disulfide (Aldrich Chemical Company) is added. The reaction mixture turns brick red and is allowed to stir at room temperature for two hours. At the end, 50 mmol of methyl iodide (Aldrich Chemical Company) is added to the reaction mixture. The reaction is stirred at room temperature overnight. A light brown solution is attained. The reaction mixture is then poured into a beaker containing 600 mL of deionized water. The yellowish-orange solid collected by filtration is washed with 400 mL of deionized water and 400 mL of 2-propanol, successively. The crude polymer is further purified by redissolving it in a minimum amount of tetrahydrofuran (small amount of N-methyl-2-pyrrolidone may be added to facilitate the dissolution of the polymer), and reprecipitating it into deionized water. The final polymer collected by filtration is washed with methanol, ethyl ether, and dried under vacuum to give 80% yields.

The structure of the precursor polymer is confirmed by Infrared, $H^1$ and $C^{13}$ NMR, UV-visible spectra as well as elemental analysis data.

Example 3

The following conversion conditions for an acetate derivative of precursor polymer (22) (R=CH$_3$CO) to a CN-PPV can be adapted for the conversion of most ester derivatives of precursor polymer (22).

A film of the acetate derivative of precursor polymer (22) is obtained by spin coating from a 4% solution of the precursor in N-methyl-2-pyrrolidone at 1000 rpm for 40 seconds, followed by 5000 rpm for two minutes to give a thickness of about 900 Å.

The conversion is carried out by heating the film in a vacuum oven under reduced pressure. The complete conversion of the acetate ester of the precursor polymer to CN-PPV requires a temperature between 280° C. to 300° C. in $10^{-5}$ to $10^{-6}$ torr vacuum for four hours. The conversion temperature can be lowered to below 200° C. in the case of xanthate ester derivative of precursor polymer (22).

The structure of the precursor polymer is confirmed by Infrared, UV-visible spectra as well as elemental analysis data.

The CN-PPV obtained by heat treatment at 300° C. under $10^{-6}$ torr vacuum of the acetate ester of precursor polymer has a peak emission at around 630 nm in its photoluminescence spectrum. The stork shift is abnormally large, around 0.8 ev.

Example 4

An organic EL device is fabricated in the following fashion:

(a) an indium tin oxide (ITO) coated glass substrate is ultrasonically cleaned in a commercial detergent, rinsed in deionized water, degreased in 2-propanol and acetone, and dried by blowing filtered nitrogen;

(b) onto the ITO layer is deposited a 300 Å hole transporting layer of PPV by thermal treatment of a film of PPV sulfonium precursor polymer, which is obtained by spin-coating from a methanol solution;

(c) a 900 Å layer of CN-PPV, as an electron transporting and emissive layer, is deposited onto the PPV layer by thermal treatment of a film of the acetate ester of the precursor polymer, which is obtained by spin-coating from N-methylpyrrolidone solution; and (d) over the emissive layer is deposited 2000 Å of aluminum to complete the organic EL device.

In operation, orange-red light becomes visible to the naked eye just above 14 volts forward bias applied between the aluminum layer and the ITO layer. The device has a measured quantum efficiency (photons per electron) of 0.1% at a luminance of 700 cd/m$^2$.

Example 5

An organic EL device is constructed in a fashion similar to that described in Example 4, except that the hole transporting layer of PPV is omitted.

In operation, orange-red light becomes visible to the naked eye at 16 volt forward bias applied between the aluminum layer and the ITO layer. The device has a measured quantum efficiency (photons per electron) of 0.06% at a luminance of 600 cd/m$^2$.

Thus, a new precursor route method for the preparation of poly(phenylene vinylene) and its derivatives is disclosed. Further, the new precursor route provides a class of new processable precursors to CN-PPV for use in light emitting devices and new preparation methods for the class of new processable precursors to CN-PPV in light emitting devices. Also, by utilizing the new processable precursors to CN- PPV in light emitting devices, relatively high work function metals can be utilized as electron injecting contacts, which metals are easily processable and have much better ambient stability, in place of the previously required metals with low work functions which are normally susceptible to atmospheric degradation, and are difficult to process and encapsulate. Therefore, utilizing the new precursor route method and the class of new processable precursors to CN-PPV in light emitting devices simplifies the fabrication and provides increased efficiency While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of preparing a class of poly(phenylene vinylene) derivatives comprising the steps of:

preparing a soluble precursor of a poly(phenylene vinylene) derivative with the following reaction

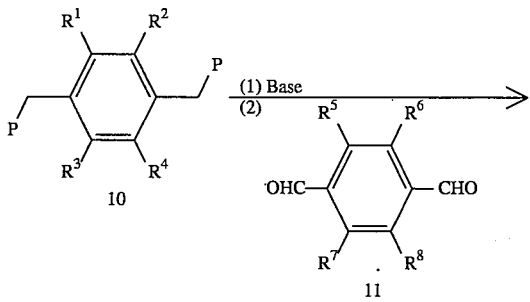

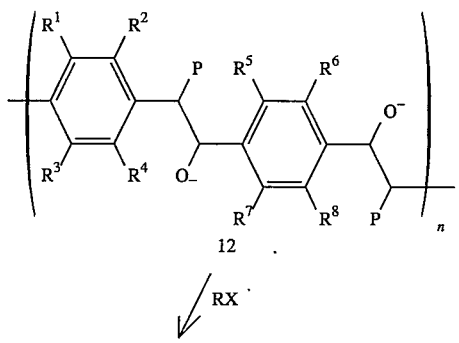

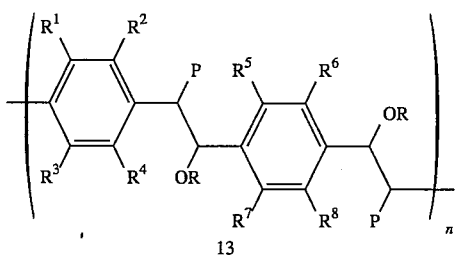

where:

P is hydrogen or an electron withdrawing group selected from the group consisting cyano, nitro, or fluoride.

RX is an organic trapping reagent;

$R^1$ to $R^8$ represent substitutional possibilities at each position and each represents hydrogen or hydrocarbon groups or functional groups selected from the group consisting of cyano, nitro, halogen, haloalkyl, haloalkoxy, alkoxyl, amido, amino, sulfonyl, carbonyl, carbonyloxy and oxycarbonyl, with the provision that $R^1$ and $R^2$ together, $R^3$ and $R^4$ together, $R^5$ and $R^6$ together, $R^7$ and $R^8$ together can form a fused benzo ring; and n is the average number of repeating units in a single polymer molecule; and converting the soluble precursor to a poly (phenylene vinylene) derivative.

2. A method of preparing a class of poly(phenylene vinylene) derivatives as claimed in claim 1 wherein the base is comprised of one of an organic, inorganic or organometallic base.

3. A method of preparing a class of poly(phenylene vinylene) derivatives as claimed in claim 1 wherein the base is comprised of NaOH, $(CH_3)_3COK$, $CH_3SO_2CH_2Li$, $NaNH_2$, NaH, PhLi, or $CH_3Li$.

4. A method of preparing a class of poly(phenylene vinylene) derivatives as claimed in claim 1 wherein the organic trapping reagent is comprised of one of carboxylic add anhydride, carboxylic acid chloride, alkyl sulfonyl chloride, carboxylic ester, or xanthate ester.

5. A method of preparing a class of poly(phenylene vinylene) derivatives as claimed in claim 1 wherein the organic trapping reagent is comprised Of one of acetic anhydride, trifluoroacetic anhydride, acetic chloride, methanesulfonyl chloride, or carbon disulfide/methyl iodide.

6. A method of preparing a class of poly(phenylene vinylene) derivatives as claimed in claim 1 wherein the preferred initial polymerization temperature is below 0° C.

7. A method of preparing a class of poly(phenylene vinylene) derivatives as claimed in claim 1 wherein the step of converting further comprises performing either a thermal treatment or an acid-catalyzed ultraviolet radiation treatment.

8. A method of preparing a class of poly(phenylene vinylene) derivatives as claimed in claim 7 wherein the step of performing either a thermal treatment or an acid-catalyzed ultraviolet radiation treatment comprises the following reaction:

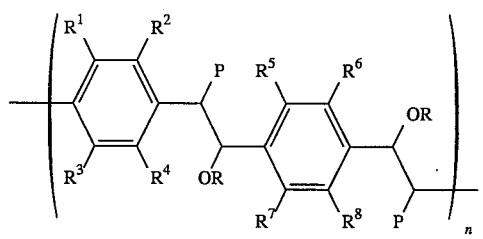

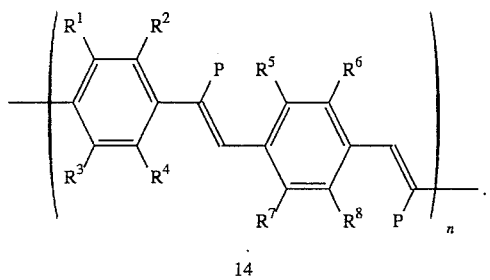

14

9. A method of preparing a class of poly(phenylene vinylene) derivatives as claimed in claim 7 wherein the step of converting by a thermal treatment comprises heating at a temperature in the range of 25° C. to 400° C.

10. A method of preparing a class of poly(phenylene vinylene) derivatives as claimed in claim 7 wherein the step of converting by a thermal treatment comprises heating at a temperature in the preferred range of 120° C. to 300° C.

11. A method of preparing a class of poly(phenylene vinylene) derivatives as claimed in claim 1 wherein the step of preparing comprises the preparation of a soluble precursor polymer of poly(cyanoterephthalydene).

12. A method of preparing a class of poly(phenylene vinylene) derivatives as claimed in claim 11 wherein the preparation of a soluble precursor polymer of poly(cyanoterephthalydene) comprises the following reaction:

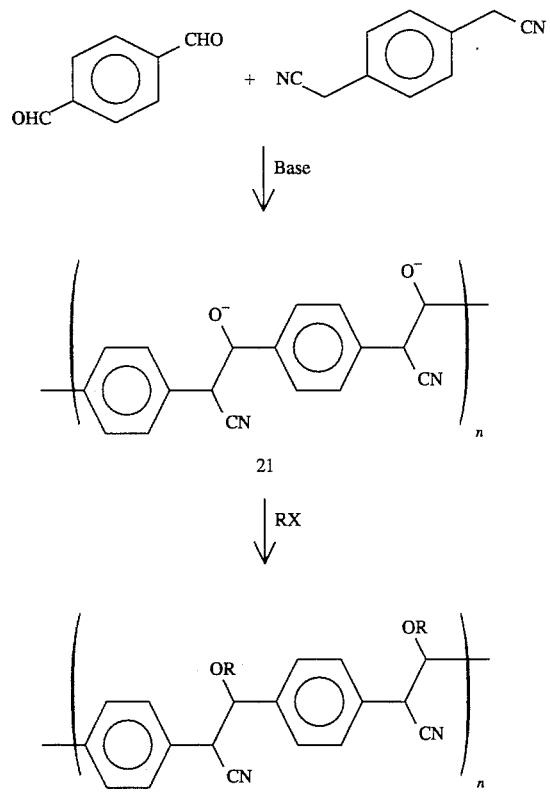

where: RX is an organic trapping reagent.

13. A method of preparing a class of poly(phenylene vinylene) derivatives as claimed in claim 11 wherein the preparation of a soluble precursor polymer of poly(cyanoterephthalydene) includes using an organic trapping reagent comprising one of acetic anhydride, trifluoroacetic anhydride, acetic chloride, methanesulfonyl chloride, or carbon disulfide/methyl iodide.

14. A method of preparing a class of poly(phenylene vinylene) derivatives as claimed in claim 11 wherein the preparation of a soluble precursor polymer of poly(cyanoterephthalydene) further comprises using a base of potassium t-butoxide.

15. A method of preparing a class of poly(phenylene vinylene) derivatives as claimed in claim 1 wherein the step of preparing a soluble precursor of a poly(phenylene vinylene) derivative comprises the preparation of poly(cyanoterephthalydene) from a soluble precursor polymer by performing either a thermal treatment or an acid-catalyzed ultraviolet radiation treatment.

16. A method of preparing a class of poly(phenylene vinylene) derivatives as claimed in claim 15 wherein the step of preparing poly(cyanoterephthalydene) from a soluble precursor polymer by performing either a thermal treatment or an acid-catalyzed ultraviolet radiation treatment comprises the following reaction:

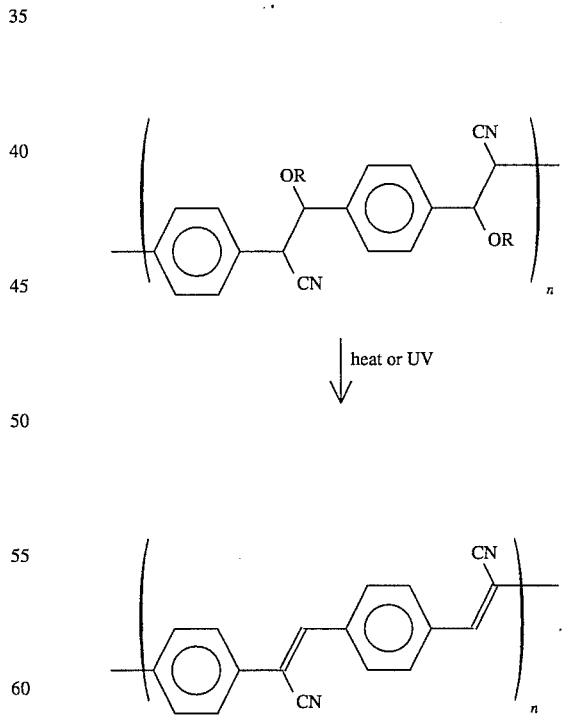

* * * * *

UNITED STATES PATENT AND TRADEMARK OFFICE
CERTIFICATE OF CORRECTION

PATENT NO. : 5,473,047
DATED : December 5, 1995
INVENTOR(S) : Song Shi

It is certified that error appears in the above-indentified patent and that said Letters Patent is hereby corrected as shown below:

Claim 4, column 12, line 28, replace "add" with --acid --.
Claim 5, column 12, line 32, replace "OF" with --of --.

Signed and Sealed this

Twenty-eighth Day of May, 1996

Attest:

BRUCE LEHMAN

*Attesting Officer*     *Commissioner of Patents and Trademarks*